United States Patent
Lee et al.

(10) Patent No.: US 10,424,558 B2
(45) Date of Patent: Sep. 24, 2019

(54) DISPLAY APPARATUS WITH A DATA DRIVING CHIP AND A GATE DRIVING CHIP DISPOSED ON A SAME SIDE OF A DISPLAY PANEL

(71) Applicant: SAMSUNG DISPLAY CO., LTD., Yongin-si, Gyeonggi-do (KR)

(72) Inventors: Sang-Chul Lee, Yongin-si (KR); Jin-Soo Jung, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 464 days.

(21) Appl. No.: 15/149,711

(22) Filed: May 9, 2016

(65) Prior Publication Data
US 2017/0061857 A1   Mar. 2, 2017

(30) Foreign Application Priority Data
Aug. 27, 2015  (KR) .................. 10-2015-0120962

(51) Int. Cl.
*G06F 3/038* (2013.01)
*H01L 25/065* (2006.01)
*H01L 23/00* (2006.01)

(52) U.S. Cl.
CPC . *H01L 25/0657* (2013.01); *G09G 2300/0408* (2013.01); *G09G 2300/0426* (2013.01); *H01L 24/05* (2013.01); *H01L 24/32* (2013.01); *H01L 24/48* (2013.01); *H01L 24/49* (2013.01); *H01L 24/73* (2013.01); *H01L 2224/04026* (2013.01); *H01L 2224/04042* (2013.01); *H01L 2224/16145* (2013.01); *H01L 2224/293* (2013.01); *H01L 2224/2919* (2013.01); *H01L 2224/2929* (2013.01); *H01L 2224/32145* (2013.01); *H01L 2224/32225* (2013.01); *H01L 2224/33181* (2013.01); *H01L 2224/48091* (2013.01); *H01L 2224/48108* (2013.01); *H01L 2224/48145* (2013.01); *H01L 2224/48147* (2013.01); *H01L 2224/48148* (2013.01); *H01L 2224/48228* (2013.01); *H01L 2224/49171* (2013.01); *H01L 2224/73265* (2013.01);
(Continued)

(58) Field of Classification Search
CPC ............... H01L 25/0658; H01L 24/05; G09G 2300/0408; G09G 2300/0426
USPC ......................................................... 345/204
See application file for complete search history.

(56) References Cited

U.S. PATENT DOCUMENTS

| | | | | |
|---|---|---|---|---|
| 2004/0140547 A1* | 7/2004 | Yamazaki | ........... | H01L 21/6835 257/686 |
| 2004/0246684 A1* | 12/2004 | Karaki | ...................... | G06F 1/10 361/749 |

(Continued)

*Primary Examiner* — Jonathan M Blancha
(74) *Attorney, Agent, or Firm* — F. Chau & Associates, LLC

(57) ABSTRACT

A display apparatus includes a display panel and a display panel driver. The display panel includes a first substrate and a second substrate facing the first substrate, wherein the first substrate includes a switching element, a data line and a gate line, wherein the data line and the gate line are electrically connected to the switching element. The display panel driver includes a data driving chip and a gate driving chip, wherein the data driving chip applies a data signal to the data line and the gate driving chip applies a gate signal to the gate line, wherein the gate driving chip is disposed on a surface of the data driving chip.

22 Claims, 18 Drawing Sheets

(52) U.S. Cl.
CPC ............... *H01L 2225/0651* (2013.01); *H01L 2225/06506* (2013.01); *H01L 2924/00014* (2013.01)

(56) References Cited

U.S. PATENT DOCUMENTS

| | | | |
|---|---|---|---|
| 2005/0057580 A1* | 3/2005 | Yamano | G09G 3/3241 345/690 |
| 2007/0167036 A1* | 7/2007 | Kim | G09G 3/3611 439/66 |
| 2013/0057531 A1* | 3/2013 | Lim | G09G 3/20 345/211 |
| 2014/0104252 A1 | 4/2014 | Park et al. | |
| 2014/0375933 A1* | 12/2014 | Park | G02F 1/133502 349/96 |
| 2015/0364070 A1* | 12/2015 | Lv | G09G 3/3685 345/690 |

* cited by examiner

DISPLAY APPARATUS WITH A DATA DRIVING CHIP AND A GATE DRIVING CHIP DISPOSED ON A SAME SIDE OF A DISPLAY PANEL

CROSS-REFERENCE TO RELATED APPLICATION

This application claims priority under 35 U.S.C. § 119 to Korean Patent Application No. 10-2015-0120962, filed on Aug. 27, 2015, in the Korean Intellectual Property Office (KIPO), the disclosure of which is incorporated by reference herein in its entirety.

TECHNICAL FIELD

Exemplary embodiments of the present invention relate to a display apparatus. More particularly, exemplary embodiments of the present invention relate to a display apparatus including a driver applying a driving signal.

DISCUSSION OF THE RELATED ART

Generally, a display apparatus includes a display panel and a display panel driver. A driving chip of the display panel driver may be mounted as a chip on glass (COG) on a peripheral region of the display panel. In addition, the driving chip of the display panel driver may be mounted on a flexible film connected to the peripheral region of the display panel as a chip on film (COF).

The driving chip may include a plurality of data driving chips disposed on a long side of the display panel and a plurality of gate driving chips disposed on a short side of the display panel.

Accordingly, a size of a bezel of the display panel may be large and the installation of the gate and data driving chips may be time consuming.

SUMMARY

According to an exemplary embodiment of the present invention, a display apparatus includes a display panel and a display panel driver. The display panel includes a first substrate and a second substrate facing the first substrate, wherein the first substrate includes a switching element, a data line and a gate line, wherein the data line and the gate line are electrically connected to the switching element. The display panel driver includes a data driving chip and a gate driving chip, wherein the data driving chip applies a data signal to the data line and the gate driving chip applies a gate signal to the gate line, wherein the gate driving chip is disposed on a surface of the data driving chip.

In an exemplary embodiment of the present invention, the display panel driver further includes a printed circuit board including a driving circuit and a flexible substrate including a plurality of bonding pads, wherein the flexible substrate electrically connects the printed circuit board with the display panel. The data driving chip is disposed on the flexible substrate.

In an exemplary embodiment of the present invention, the data driving chip includes a data driving chip body and a first pad disposed on a top surface of the data driving chip body. The display panel driver further includes a first bonding wire electrically connecting the first pad with a first bonding pad of the plurality of bonding pads of the flexible substrate.

In an exemplary embodiment of the present invention, the gate driving chip includes a gate driving chip body and a second pad disposed on a top surface of the gate driving chip body. The display panel driver further includes a second bonding wire electrically connecting the second pad with a second bonding pad of the plurality of bonding pads of the flexible substrate.

In an exemplary embodiment of the present invention, the data driving chip further includes a third pad disposed on the top surface of the data driving chip body, wherein the second bonding wire electrically connects the second pad and the third pad with the second bonding pad of the plurality of bonding pads of the flexible substrate.

In an exemplary embodiment of the present invention, the data driving chip includes a data driving chip body and a third pad disposed on a bottom surface of the data driving chip body. The display panel driver further includes a first conductive adhesive layer disposed between the data driving chip and the flexible substrate. The first conductive adhesive layer electrically connects the third pad with a first bonding pad of the plurality of bonding pads of the flexible substrate.

In an exemplary embodiment of the present invention, the gate driving chip includes a gate driving chip body and a second pad disposed on a top surface of the gate driving chip body. The display panel driver further includes a second bonding wire electrically connecting the second pad with a second bonding pad of the plurality of bonding pads of the flexible substrate.

In an exemplary embodiment of the present invention, the data driving chip further includes a first pad disposed on a top surface of the data driving chip body. The second bonding wire electrically connects the first pad and the second pad with the second bonding pad of the plurality of bonding pads of the flexible substrate.

In an exemplary embodiment of the present invention, the gate driving chip includes a gate driving chip body and a fourth pad disposed on a bottom surface of the gate driving chip body. The data driving chip further includes a first pad disposed on a top surface of the data driving chip body. The display panel driver further includes a second conductive adhesive layer disposed between the gate driving chip and the data driving chip. The second conductive adhesive layer electrically connects the fourth pad with the first pad.

In an exemplary embodiment of the present invention, the data driving chip is disposed on the first substrate, wherein the first substrate includes a plurality of bonding pads, wherein the data driving chip is electrically connected to the first substrate through the plurality of bonding pads.

In an exemplary embodiment of the present invention, the data driving chip further includes a data driving chip body and a first pad disposed on a top surface of the data driving chip body. The display panel driver further includes a first bonding wire electrically connecting the first pad with a first bonding pad of the plurality of bonding pads of the first substrate.

In an exemplary embodiment of the present invention, the gate driving chip further includes a gate driving chip body and a second pad disposed on a top surface of the gate driving chip body. The display panel driver further includes a second bonding wire electrically connecting the second pad with a second bonding pad of the plurality of bonding pads of the first substrate.

In an exemplary embodiment of the present invention, wherein the data driving chip further includes a third pad disposed on the top surface of the data driving chip body, wherein the second bonding wire electrically connects the second pad and the third pad with the second bonding pad of the plurality of bonding pads of the first substrate.

In an exemplary embodiment of the present invention, the data driving chip includes a data driving chip body and a third pad disposed on a bottom surface of the data driving chip body. The display panel driver further includes a first conductive adhesive layer disposed between the data driving chip and the first substrate. The first conductive adhesive layer electrically connects the third pad with a first bonding pad of the plurality of bonding pads of the first substrate.

In an exemplary embodiment of the present invention, the gate driving chip includes a gate driving chip body and a second pad disposed on a top surface of the gate driving chip body. The display panel driver further includes a second bonding wire electrically connecting the second pad with a second bonding pad of the plurality of bonding pads of the first substrate.

In an exemplary embodiment of the present invention, the data driving chip further includes a first pad disposed on a top surface of the data driving chip body. The second bonding wire electrically connects the first pad and the second pad with the second bonding pad of the plurality of bonding pads of the first substrate.

In an exemplary embodiment of the present invention, the gate driving chip includes a gate driving chip body and a fourth pad disposed on a bottom surface of the gate driving chip body. The data driving chip further includes a first pad disposed on a top surface of the data driving chip body. The display panel driver further includes a second conductive adhesive layer disposed between the gate driving chip and the data driving chip. The second conductive adhesive layer electrically connects the fourth pad with the first pad.

In an exemplary embodiment of the present invention, a size of the gate driving chip is substantially the same as a size of the data driving chip in plan view.

In an exemplary embodiment of the present invention, a size of the gate driving chip is less than a size of the data driving chip in plan view.

In an exemplary embodiment of the present invention, the display panel driver further includes a sealing member covering the data driving chip and the gate driving chip.

According to an exemplary embodiment of the present invention, a display apparatus includes a display panel and a display panel driver. The display panel includes first and second substrates facing each other, wherein the first substrate includes a switching element, a data line and a gate line, wherein the data line and the gate line are electrically connected to the switching element. The display panel driver includes a data driving chip and a gate driving chip, wherein the data driving chip applies a data signal to the data line and the gate driving chip applies a gate signal to the gate line, wherein the gate driving chip overlaps the data driving chip.

In an exemplary embodiment of the present invention, the data driving chip and the gate driving chip are disposed on the first substrate, wherein the data driving chip is electrically connected to the data line through a first bonding pad disposed on the first substrate and the gate driving chip is electrically connected to the gate line through a second bonding pad disposed on the first substrate.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a first pad is disposed on a top surface of the data driving chip body and the first pad is adjacent to a first side of the data driving chip body, wherein the first side of the data driving chip body corresponds to the first side of the gate driving chip body. The first and second bonding pads are disposed on a region of the first substrate that is adjacent to the first side of the data driving chip body. A first bonding wire electrically connects the first pad with the first bonding pad, and a second bonding wire electrically connects the second pad with the second bonding pad.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a first pad is disposed on a top surface of the data driving chip body and the first pad is adjacent to a first side of the data driving chip body, wherein a third pad is disposed on the top surface of the data driving chip body and the third pad is adjacent to the first pad, wherein the first side of the data driving chip body corresponds to the first side of the gate driving chip body. The first and second bonding pads are disposed on a region of the first substrate that is adjacent to the first side of the data driving chip body. A first bonding wire electrically connects the first pad with the first bonding pad, and a second bonding wire electrically connects the second pad and the third pad with the second bonding pad.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a third pad is disposed on a bottom surface of the data driving chip body and the third pad is adjacent to a first side of the data driving chip body, wherein the first side of the data driving chip body corresponds to the first side of the gate driving chip body. The third pad is disposed on the first bonding pad, and a first conductive adhesive layer is disposed between the third pad and the first bonding pad to electrically connect the third pad with the first bonding pad. The second bonding pad is disposed on a region of the first substrate that is adjacent to the first side of the data driving chip body. A second bonding wire electrically connects the second pad with the second bonding pad.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a third pad is disposed on a bottom surface of the data driving chip body and the third pad is adjacent to a first side of the data driving chip body, wherein a first pad is disposed on a top surface of the data driving chip body and the first pad is adjacent to the first side of the data driving chip body, wherein the first side of the data driving chip body corresponds to the first side of the gate driving chip body. The third pad is disposed on the first bonding pad, and a first conductive adhesive layer is disposed between the third pad and the first bonding pad to electrically connect the third pad with the first bonding pad. The second bonding pad is disposed on a region of the first substrate that is adjacent to the first side of the data driving chip body. A second bonding wire electrically connects the second pad and the first pad with the second bonding pad.

In an exemplary embodiment of the present invention, the first substrate includes a first side and a second side, wherein the first side is longer than the second side. The data driving chip is disposed on the first side of the first substrate.

According to an exemplary embodiment of the present invention, a display apparatus includes a display panel and a display panel driver. The display panel includes first and second substrates facing each other, wherein the first substrate includes a switching element, a data line and a gate line, wherein the data line and the gate line are electrically connected to the switching element. The display panel driver includes a data driving chip, a gate driving chip, a printed circuit board including a driving circuit, and a flexible substrate including a first bonding pad and a second bonding pad. The data driving chip and the gate driving chip are disposed on the flexible substrate, and the flexible substrate electrically connects the printed circuit board with the display panel through the first and second bonding pads. The gate driving chip overlaps the data driving chip.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a first pad is disposed on a top surface of the data driving chip body and the first pad is adjacent to a first side of the data driving chip body, wherein the first side of the data driving chip body corresponds to the first side of the gate driving chip body. The first and second bonding pads are disposed on a region of the flexible substrate that is adjacent to the first side of the data driving chip body. A first bonding wire electrically connects the first pad with the first bonding pad, and a second bonding wire electrically connects the second pad with the second bonding pad.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a first pad is disposed on a top surface of the data driving chip body and the first pad is adjacent to a first side of the data driving chip body, wherein a third pad is disposed on the top surface of the data driving chip body and the third pad is adjacent to the first pad, wherein the first side of the data driving chip body corresponds to the first side of the gate driving chip body. The first and second bonding pads are disposed on a region of the flexible substrate that is adjacent to the first side of the data driving chip body. A first bonding wire electrically connects the first pad with the first bonding pad, and a second bonding wire electrically connects the second pad and the third pad with the second bonding pad.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a third pad is disposed on a bottom surface of the data driving chip body and the third pad is adjacent to a first side of the data driving chip body, wherein the first side of the data driving chip body corresponds to the first side of the gate driving chip body. The third pad is disposed on the first bonding pad, and a first conductive adhesive layer is disposed between the third pad and the first bonding pad to electrically connect the third pad with the first bonding pad. The second bonding pad is disposed on a region of the flexible substrate that is adjacent to the first side of the data driving chip body. A second bonding wire electrically connects the second pad with the second bonding pad.

In an exemplary embodiment of the present invention, the data driving chip includes a data driving chip body, and the gate driving chip includes a gate driving chip body. A second pad is disposed on a top surface of the gate driving chip body and the second pad is adjacent to a first side of the gate driving chip body, wherein a third pad is disposed on a bottom surface of the data driving chip body and the third pad is adjacent to a first side of the data driving chip body, wherein a first pad is disposed on a top surface of the data driving chip body and the first pad is adjacent to the first side of the data driving chip body, wherein the first side of the data driving chip body corresponds to the first side of the gate driving chip body. The third pad is disposed on the first bonding pad, and a first conductive adhesive layer is disposed between the third pad and the first bonding pad to electrically connect the third pad with the first bonding pad. The second bonding pad is disposed on a region of the flexible substrate that is adjacent to the first side of the data driving chip body. A second bonding wire electrically connects the second pad and the first pad with the second bonding pad.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
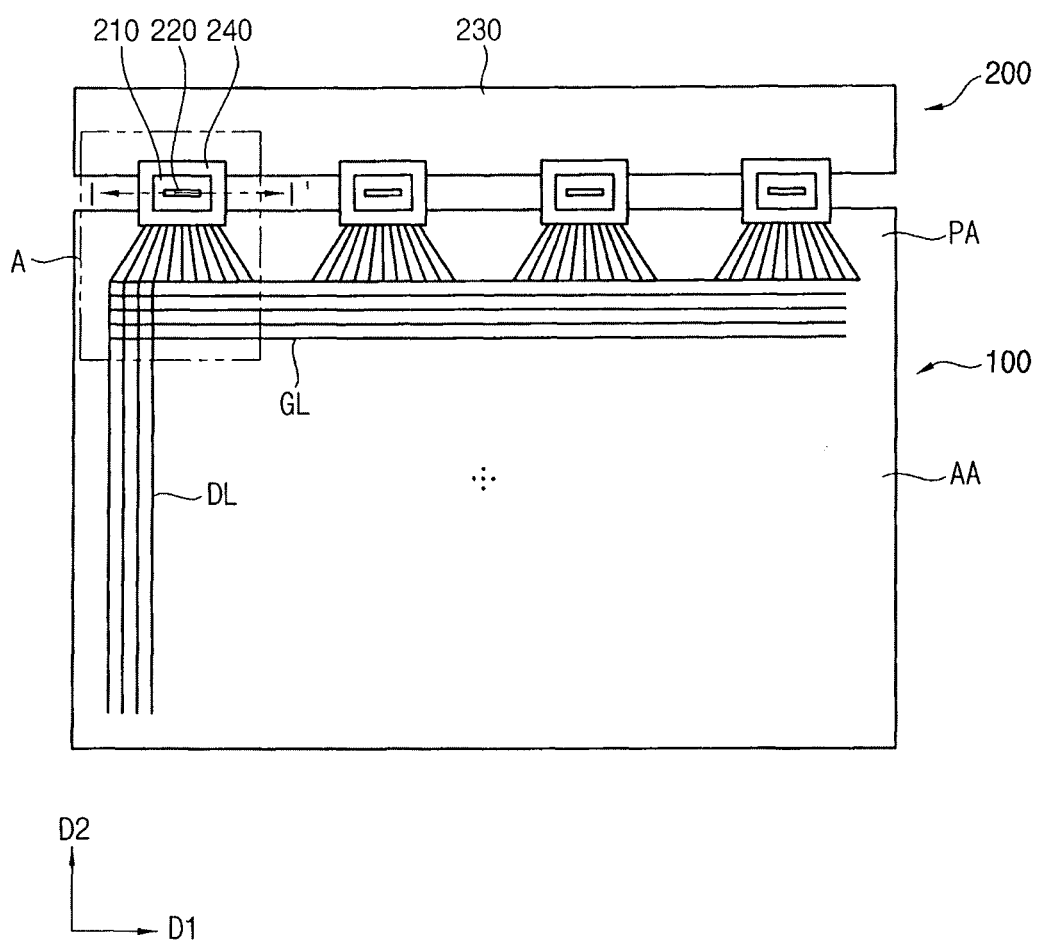
FIG. 1 is a plan view illustrating a display apparatus according to an exemplary embodiment of the present invention.

Exemplary embodiments of the present invention will now be described more fully with reference to the accompanying drawings. The present invention may, however, be embodied in many different forms and should not be construed as limited to the exemplary embodiments set forth herein. Like reference numerals may refer to like elements throughout this application.

Figure 2:
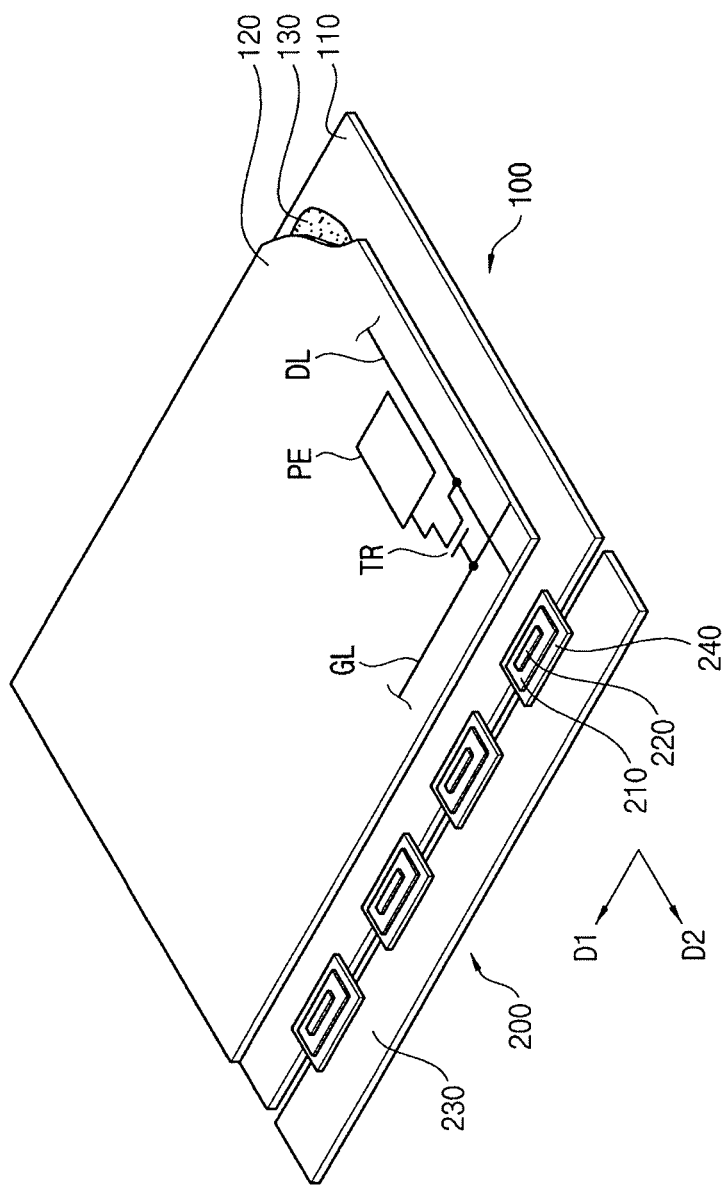
FIG. 2 is a perspective view illustrating the display apparatus of FIG. 1, according to an exemplary embodiment of the present invention.
Figure 3:
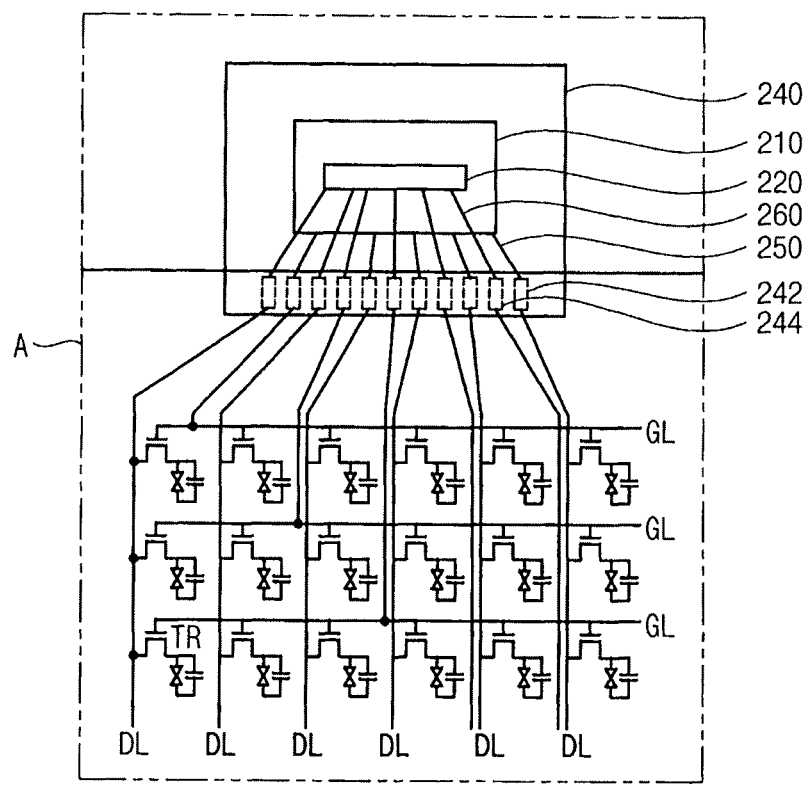
FIG. 3 is an enlarged view of region A of FIG. 1, according to an exemplary embodiment of the present invention.
Figure 4:
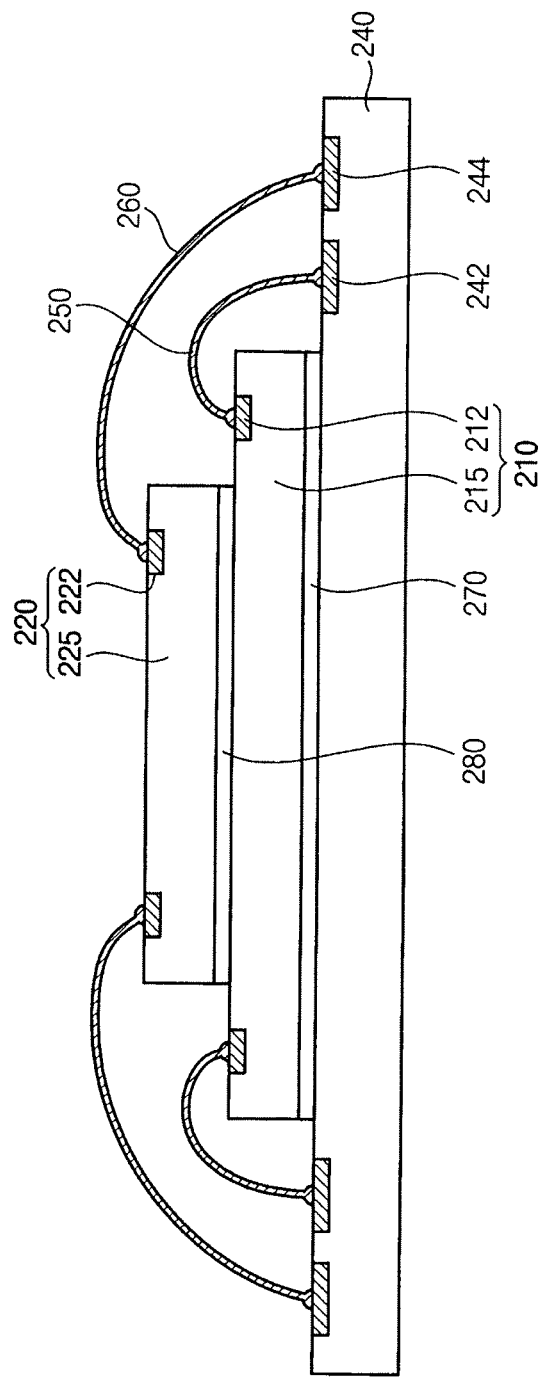
FIG. 4 is a cross-sectional view taken along line I-I' of FIG. 1, according to an exemplary embodiment of the present invention.

FIG. 1 is a plan view illustrating a display apparatus according to an exemplary embodiment of the present invention. FIG. 2 is a perspective view illustrating the display apparatus of FIG. 1, according to an exemplary embodiment of the present invention. FIG. 3 is an enlarged view of region A of FIG. 1, according to an exemplary embodiment of the present invention. FIG. 4 is a cross-sectional view taken along line I-I' of FIG. 1, according to an exemplary embodiment of the present invention.

Referring to FIGS. 1 to 4, a display apparatus includes a display panel 100 and display panel driver 200.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

For example, the first substrate 110 may be an array substrate. The gate lines GL and the data lines DL may be disposed on the first substrate 110. A plurality of switching elements TR connected to the gate lines GL and the data lines DL may be disposed on the first substrate 110. A pixel electrode PE may be disposed on the first substrate 110.

The second substrate 120 may be a corresponding substrate opposite to the first substrate 110. A common electrode facing the pixel electrode PE may be disposed under the second substrate 120. A color filter defining a color of the pixel may be disposed under the second substrate 120. Alternatively, the common electrode may be disposed on the first substrate 110. The color filter may be disposed on the first substrate 110.

An overlap area between the first substrate 110 and the second substrate 120 may be substantially the same as the active region AA of the display panel 100. Alternatively, the overlap area between the first substrate 110 and the second substrate 120, except for the area where a sealing member is disposed, may be defined to the active region AA of the display panel 100. As an example, the active region AA is an area where the first and second substrates 110 and 120 overlap, excluding a sealing member that seals the first and second substrates 110 and 120.

The display apparatus may further include a display unit 130 interposed between the first and second substrates 110 and 120. The display unit 130 may include an organic light emitting layer. Alternatively the display unit 130 may include a liquid crystal layer.

The display panel driver 200 may include a data driving chip 210 and a gate driving chip 220. The display panel driver 200 may further include a printed circuit board 230 and a flexible substrate 240 having a plurality of bonding pads 242 and 244. The plurality of bonding pads 242 and 244 may be disposed on a top surface of the flexible substrate 240. The flexible substrate 240 may electrically connect the printed circuit board 230 and the display panel 100.

For example, the printed circuit board 200 may include a driving circuit such as a timing controller, a power voltage generator, etc. In addition, the flexible substrate 240 may include polyimide.

The timing controller receives input image data and an input control signal from an external apparatus. The input image data may include red image data, green image data and blue image data. The input control signal may include a master clock signal and a data enable signal. The input control signal may further include a vertical synchronizing signal and a horizontal synchronizing signal.

The timing controller generates a first control signal, a second control signal and a data signal based on the input image data and the input control signal.

The timing controller generates the first control signal for controlling an operation of the gate driving chip 220 based on the input control signal, and outputs the first control signal to the gate driving chip 220.

The timing controller generates the second control signal for controlling an operation of the data driving chip 210 based on the input control signal, and outputs the second control signal to the data driving chip 210.

The timing controller generates a data signal based on the input image data. The timing controller outputs the data signal to the data driving chip 210.

The gate driving chip 220 generates gate signals driving the gate lines GL in response to the first control signal received from the timing controller. The gate driving chip 220 sequentially outputs the gate signals to the gate lines GL.

The data driving chip 210 receives the second control signal and the data signal from the timing controller. The data driving chip 210 converts the data signal into analog data voltages. The data driving chip 210 outputs the analog data voltages to the data lines DL.

The data driving chip 210 may be mounted on the flexible substrate 240 as a chip on film (COF). For example, the data driving chip 210 may be adhered to the flexible substrate 240 by an adhesive layer 270 interposed between the data driving chip 210 and the flexible substrate 240.

The data driving chip 210 may include a data driving chip body 215 and a plurality of first pads 212 disposed on a top surface of the data driving chip body 215. In addition, the display panel driver 200 may further include a first bonding wire 250 electrically connecting at least one first pad 212 with at least one bonding pad 242 of the flexible substrate 240.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 disposed on a top surface of the gate driving chip body 225. In addition, the display panel driver 200 may further include a second bonding wire 260 electrically connecting at least one second pad 222 with at least one bonding pad 244 of the flexible substrate 240.

The at least one bonding pad 242 of the flexible substrate 240 may be electrically connected to one of the data lines DL, and the at least one bonding pad 244 of the flexible substrate 240 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

Figure 5:
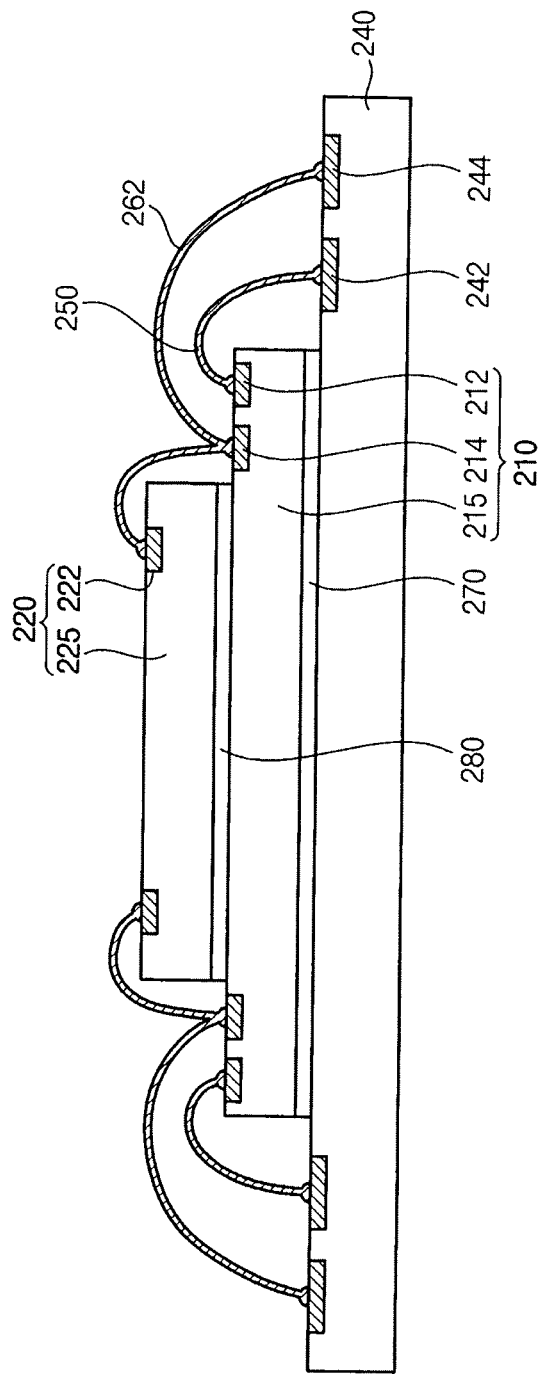
FIG. 5 is a cross-sectional view illustrating a display panel driver, according to an exemplary embodiment of the present invention.

FIG. 5 is a cross-sectional view illustrating a display panel driver, according to an exemplary embodiment of the present invention. The display panel driver of FIG. 5 may be substantially the same as that of FIGS. 1 to 4, except for a shape of a second bonding wire and pads that the second bonding wire connects. Accordingly, a repetitive description of elements already described may be omitted for brevity.

Referring to FIGS. 1, 2 and 5, a display apparatus includes a display panel 100 and display panel driver 200.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

The display panel driver 200 may include a data driving chip 210 and a gate driving chip 220. The display panel driver 200 may further include a printed circuit board 230 and a flexible substrate 240 having a plurality of bonding pads 242 and 244. The flexible substrate 240 may electrically connect the printed circuit board 230 and the display panel 100.

The data driving chip 210 may be mounted on the flexible substrate 240 as a COF. For example, the data driving chip 210 may be adhered to the flexible substrate 240 by an adhesive layer 270 interposed between the data driving chip 210 and the flexible substrate 240.

The data driving chip 210 may include a data driving chip body 215 and a plurality of first pads 212 and 214 disposed on a top surface of the data driving chip body 215. In addition, the display panel driver 200 may further include a first bonding wire 250 electrically connecting at least one first pad 212 with at least one bonding pad 242 of the flexible substrate 240.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 disposed on a top surface of the gate driving chip body 225. In addition, the display panel driver 200 may further include a second bonding wire 262. The second bonding wire 262 electrically connects at least one second pad 222 with at least one first pad 214, and electrically connects the at least one first pad 214 with at least one bonding pad 244 of the flexible substrate 240.

For example, the at least one bonding pad 242 of the flexible substrate 240 may be electrically connected to one of the data lines DL, and the at least one bonding pad 244 of the flexible substrate 240 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The second bonding wire 262 may electrically connect the at least one bonding pad 244 of the flexible substrate 240 with the at least one second pad 222 through the at least one first pad 214 on the top surface of the data driving chip body 215 to increase electrical reliability.

Figure 6:
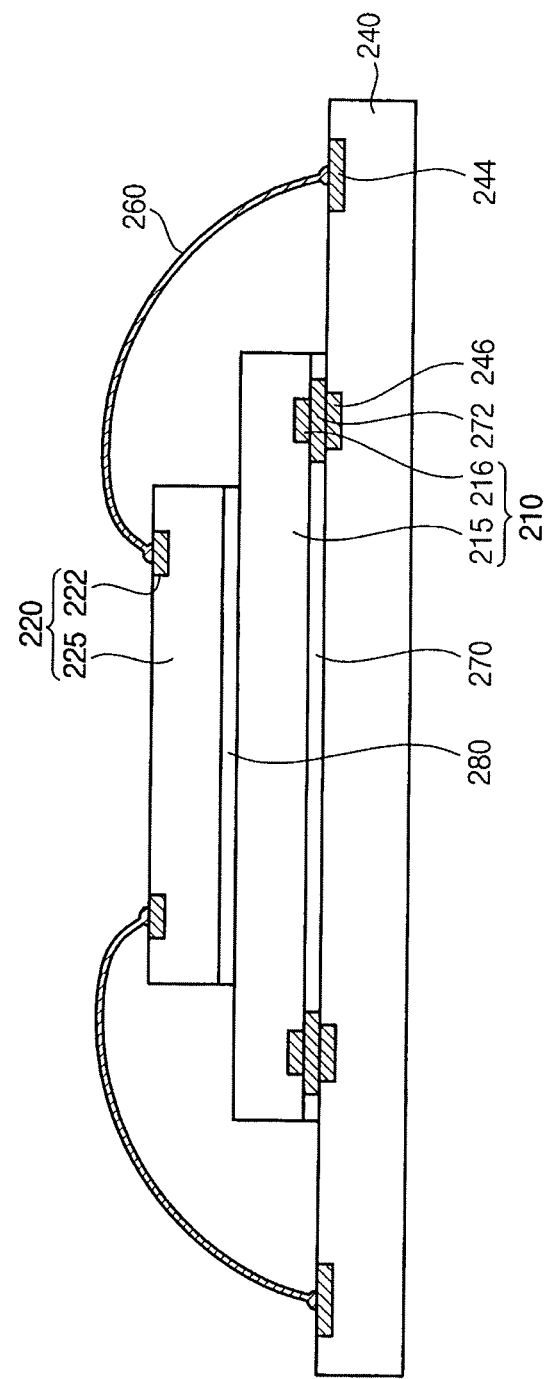
FIG. 6 is a cross-sectional view illustrating a display panel driver, according to an exemplary embodiment of the present invention.

FIG. 6 is a cross-sectional view illustrating a display panel driver, according to an exemplary embodiment of the present invention. The display panel driver of FIG. 6 may be substantially the same as that of FIGS. 1 to 4, except for a first conductive adhesive layer and pads disposed between a flexible substrate and a data driving chip. Accordingly, a repetitive description of elements already described may be omitted for brevity.

Referring to FIGS. 1, 2 and 6, a display apparatus includes a display panel 100 and display panel driver 200.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

The display panel driver 200 may include a data driving chip 210 and a gate driving chip 220. The display panel driver 200 may further include a printed circuit board 230 and a flexible substrate 240 having a plurality of bonding pads 246 and 244. The flexible substrate 240 may electrically connect the printed circuit board 230 and the display panel 100.

The data driving chip 210 may be mounted on the flexible substrate 240 as a COF. For example, the data driving chip 210 may be adhered to the flexible substrate 240 by an adhesive layer 270 interposed between the data driving chip 210 and the flexible substrate 240.

The data driving chip 210 may include a data driving chip body 215 and a plurality of third pads 216 disposed on a bottom surface of the data driving chip body 215. In addition, the display panel driver 200 may further include a first conductive adhesive layer 272 interposed between the data driving chip 210 and the flexible substrate 240. The first conductive adhesive layer 272 may electrically connect at least one third pad 216 with at least one bonding pad 246 of the flexible substrate 240.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 arranged along a top surface of the gate driving chip body 225. In addition, the display panel driver 200 may further include a second bonding wire 260 electrically connecting at least one second pad 222 with at least one bonding pad 244 of the flexible substrate 240.

For example, the at least one bonding pad 246 of the flexible substrate 240 may be electrically connected to one of the data lines DL, and the at least one bonding pad 244 of the flexible substrate 240 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The data driving chip 210 may be electrically connected to the flexible substrate 240 not through a bonding wire but through the first conductive adhesive layer 272 such that a manufacturing process of the display device is simplified.

Figure 7:
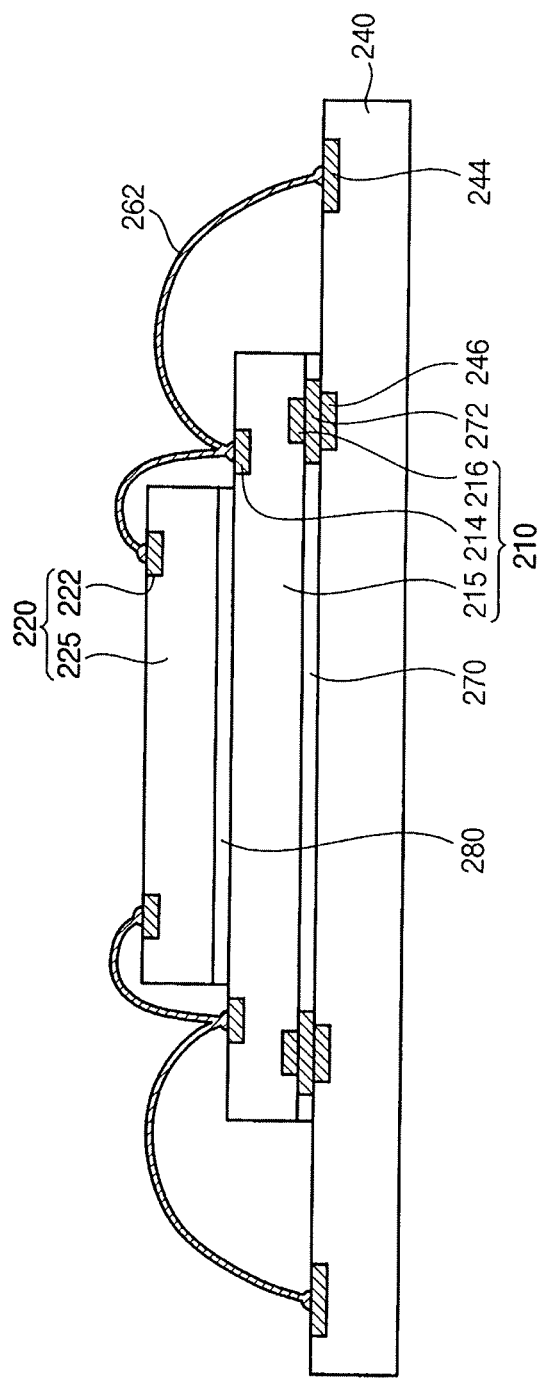
FIG. 7 is a cross-sectional view illustrating a display panel driver, according to an exemplary embodiment of the present invention.

FIG. 7 is a cross-sectional view illustrating a display panel driver, according to an exemplary embodiment of the present invention. The display panel driver of FIG. 7 may be substantially the same as that of FIG. 6, except for a shape of a second bonding wire and pads that the second bonding wire connects. Accordingly, a repetitive description of elements already described may be omitted for brevity.

Referring to FIGS. 1, 2 and 7, a display apparatus includes a display panel 100 and display panel driver 200.

The display panel 100 includes an active region AA on which an image is displayed and a peripheral region PA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

The display panel driver 200 may include a data driving chip 210 and a gate driving chip 220. The display panel driver 200 may further include a printed circuit board 230 and a flexible substrate 240 having a plurality of bonding pads 246 and 244. The flexible substrate 240 may electrically connect the printed circuit board 230 and the display panel 100.

The data driving chip 210 may be mounted on the flexible substrate 240 as a COF. For example, the data driving chip 210 may be adhered to the flexible substrate 240 by an adhesive layer 270 interposed between the data driving chip 210 and the flexible substrate 240.

The data driving chip 210 may include a data driving chip body 215, a plurality of third pads 216 disposed on a bottom surface of the data driving chip body 215 and a plurality of first pads 214 disposed on a top surface of the data driving chip body 215. In addition, the display panel driver 200 may further include a first conductive adhesive layer 272 interposed between the data driving chip 210 and the flexible substrate 240. The first conductive adhesive layer 272 may electrically connect at least one third pad 216 with at least one bonding pad 246 of the flexible substrate 240.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 disposed on a top surface of the gate driving chip body 225. In addition, the display panel driver 200 may further include a second bonding wire 262. The second bonding wire 262 electrically connects at least one second pad 222 with at least one first pad 214, and the at least one first pad 214 with at least one bonding pad 244 of the flexible substrate 240.

For example, the at least one bonding pad 246 of the flexible substrate 240 may be electrically connected to one of the data lines DL, and the at least one bonding pad 244 of the flexible substrate 240 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The data driving chip 210 may be electrically connected to the flexible substrate 240 not through a bonding wire but through the first conductive adhesive layer 272 such that a manufacturing process of the display device is simplified.

In addition, the second bonding wire 262 may be electrically connected to the at least one bonding pad 244 of the flexible substrate 240 through the at least one first pad 214 to increase an electrical reliability of the display apparatus.

Figure 8:
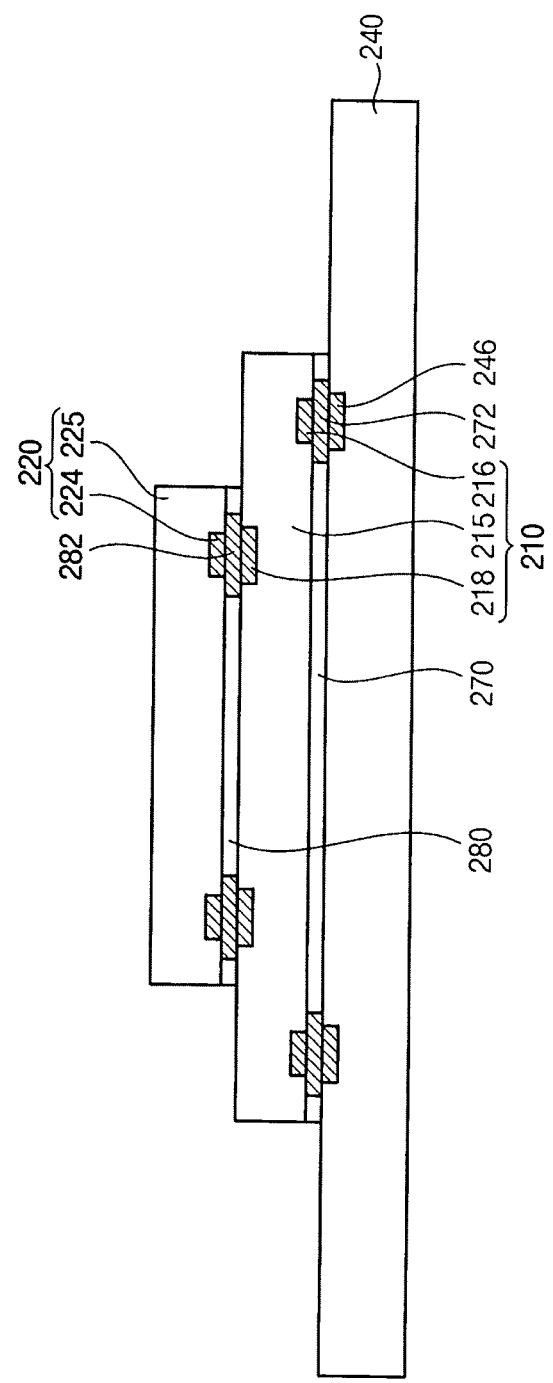
FIG. 8 is a cross-sectional view illustrating a display panel driver, according to an exemplary embodiment of the present invention.

FIG. 8 is a cross-sectional view illustrating a display panel driver, according to an exemplary embodiment of the present invention. The display panel driver of FIG. 8 may be substantially the same as that of FIG. 7, except for a second conductive adhesive layer and pads disposed between a data driving chip and a gate driving chip. Accordingly, a repetitive description of elements already described may be omitted for brevity.

Referring to FIGS. 1, 2 and 8, a display apparatus includes a display panel 100 and display panel driver 200.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

The display panel driver 200 may include a data driving chip 210 and a gate driving chip 220. The display panel driver 200 may further include a printed circuit board 230 and a flexible substrate 240 having a plurality of bonding pads 246. The flexible substrate 240 may electrically connect the printed circuit board 230 and the display panel 100.

The data driving chip 210 may be mounted on the flexible substrate 240 as a COF. For example, the data driving chip 210 may be adhered to the flexible substrate 240 by an adhesive layer 270 interposed between the data driving chip 210 and the flexible substrate 240.

The data driving chip 210 may include a data driving chip body 215, a plurality of third pads 216 disposed on a bottom surface of the data driving chip body 215 and a plurality of first pads 218 disposed on a top surface of the data driving chip body 215. In addition, the display panel driver 200 may further include a first conductive adhesive layer 272 interposed between the data driving chip 210 and the flexible substrate 240. The first conductive adhesive layer 272 may electrically connect at least one third pad 216 with at least one bonding pad 246 of the flexible substrate 240.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of fourth pads 224 disposed on a bottom surface of the gate driving chip body 225. The display panel driver 200 may further include a second conductive adhesive layer 282 interposed between the gate driving chip 220 and the data driving chip 210. The second conductive adhesive layer 282 may electrically connect at least one fourth pad 224 with at least one first pad 218.

For example, the at least one bonding pad 246 of the flexible substrate 240 may be electrically connected to one of the data lines DL or one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The data driving chip 210 and gate driving chip 220 may be electrically connected to the flexible substrate 240 not through a bonding wire but through the first conductive adhesive layer 272 and the second conductive adhesive layer 282 such that a manufacturing process of the display device is simplified.

Figure 9:
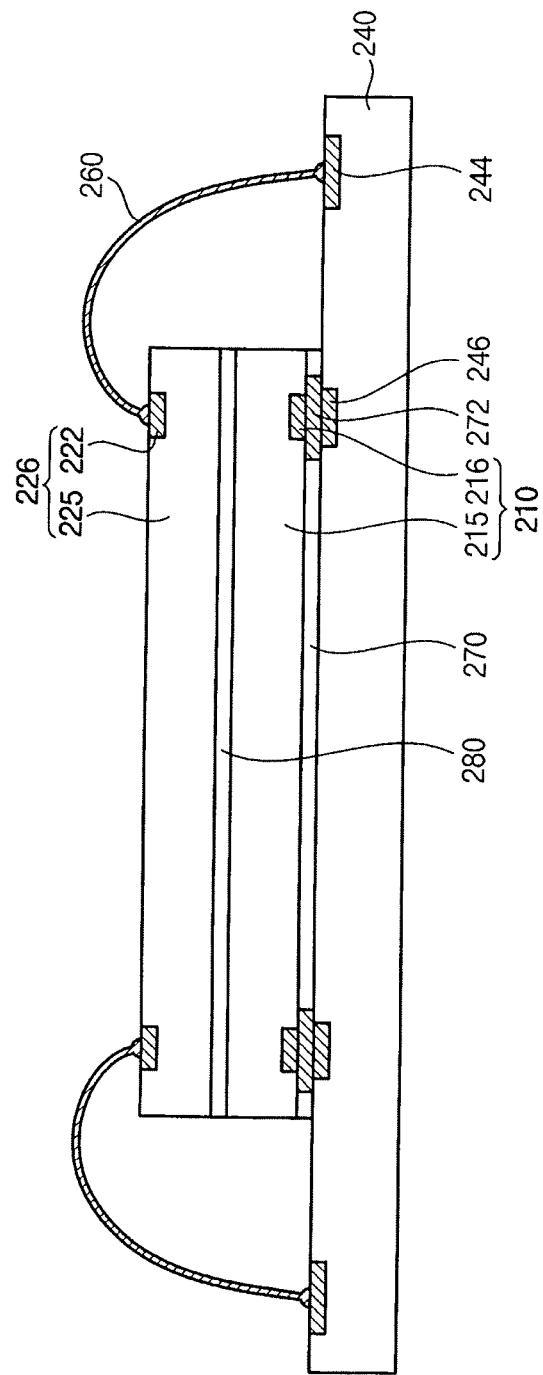
FIG. 9 is a cross-sectional view illustrating a display panel driver, according to an exemplary embodiment of the present invention.

FIG. 9 is a cross-sectional view illustrating a display panel driver, according to an exemplary embodiment of the present invention. The display panel driver of FIG. 9 may be substantially the same as that of FIG. 6, except for a planar size of a gate driving chip. Accordingly, a repetitive description of elements already described may be omitted for brevity.

Referring to FIGS. 1, 2 and 9, a display apparatus includes a display panel 100 and display panel driver 200.

The display panel 100 includes an active region AA on which an image is displayed and a peripheral region PA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

The display panel driver 200 may include a data driving chip 210 and a gate driving chip 226. The display panel driver 200 may further include a printed circuit board 230 and a flexible substrate 240 having a plurality of bonding pads 246 and 244. The flexible substrate 240 may electrically connect the printed circuit board 230 and the display panel 100.

The data driving chip 210 may be mounted on the flexible substrate 240 as a COF. For example, the data driving chip 210 may be adhered to the flexible substrate 240 by an adhesive layer 270 interposed between the data driving chip 210 and the flexible substrate 240.

The data driving chip 210 may include a data driving chip body 215 and a plurality of third pads 216 disposed on a bottom surface of the data driving chip body 215. In addition, the display panel driver 200 may further include a first conductive adhesive layer 272 interposed between the data driving chip 210 and the flexible substrate 240. The first conductive adhesive layer 272 may electrically connect at least one third pad 216 with at least one bonding pad 246 of the flexible substrate 240.

The gate driving chip 226 may be stacked on the data driving chip 210. For example, the gate driving chip 226 may adhere to the top surface of the data driving chip body 215 by an adhesive layer 280 interposed between the gate driving chip 226 and the data driving chip 210.

The gate driving chip 226 may include a gate driving chip body 225 and a plurality of second pads 222 arranged along a top surface of the gate driving chip body 225. In addition, the display panel driver 200 may further include a second bonding wire 260 electrically connecting at least one second pad 222 with at least one bonding pad 244 of the flexible substrate 240.

In an exemplary embodiment of the present invention, a size of the gate driving chip 220 may be substantially the same as a size of the data driving chip 210 in plan view. For example, the gate driving chip 220 may have the same size as the data driving chip 210 in a plan view, or the gate driving chip 220 may be smaller than the data driving chip 210 in a plan view.

For example, the at least one bonding pad 246 of the flexible substrate 240 may be electrically connected to one of the data lines DL, and the at least one bonding pad 244 of the flexible substrate 240 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

In particular, the data driving chip 210 may be electrically connected to the flexible substrate 240 not through a bonding wire but through the first conductive adhesive layer 272 such that a manufacturing process becomes easy.

In addition, the size of the gate driving chip 226 and the size of the data driving chip 210 may be substantially the same as each other such that it is easy to align the gate driving chip 226 and the data driving chip 210 for stacking the gate driving chip 226 on the data driving chip 210.

Figure 10:
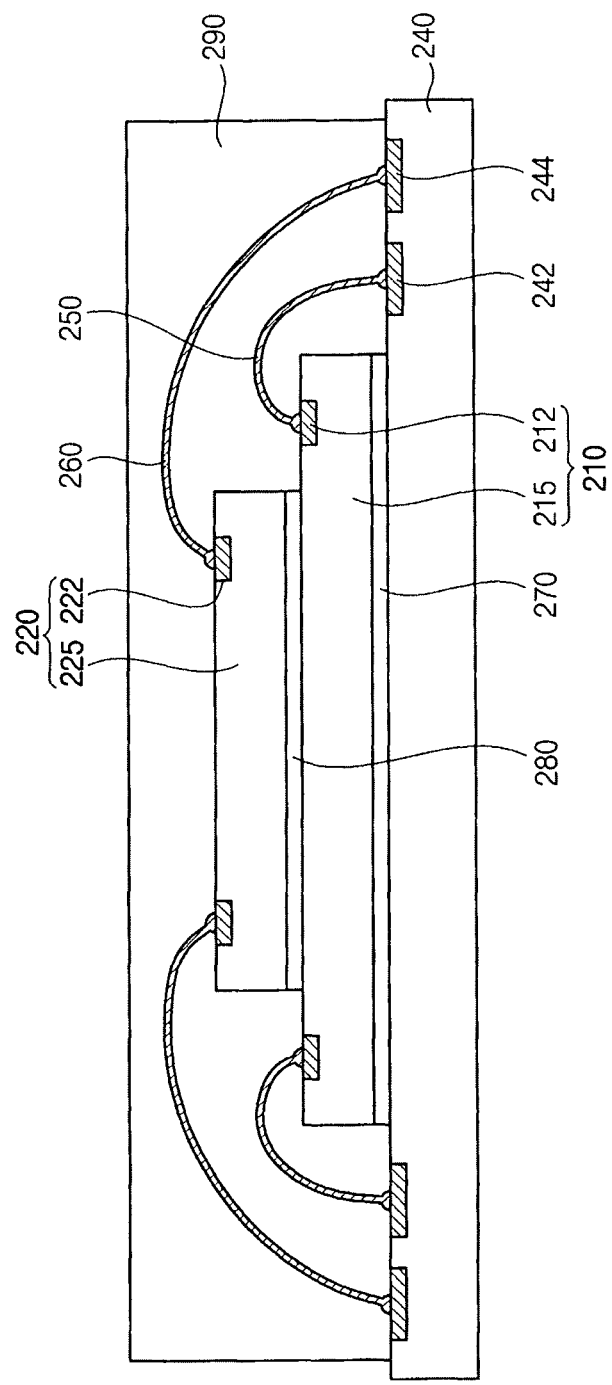
FIG. 10 is a cross-sectional view illustrating a display panel driver, according to an exemplary embodiment of the present invention.

FIG. 10 is a cross-sectional view illustrating a display panel driver, according to an exemplary embodiment of the present invention. The display panel driver of FIG. 10 may be substantially the same as that of FIGS. 1 to 4, except for a sealing member that seals a data driving chip and a gate driving chip disposed on a flexible substrate. Accordingly, a repetitive description of elements already described may be omitted for brevity.

Referring to FIGS. 1, 2 and 10, a display apparatus includes a display panel 100 and display panel driver 200.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110.

The display panel driver 200 may include a data driving chip 210, a gate driving chip 220 and a sealing member 290 covering the data driving chip 210 and the gate driving chip 220. The display panel driver 200 may further include a printed circuit board 230 and a flexible substrate 240 having a plurality of bonding pads 242 and 244. The flexible substrate 240 may electrically connect the printed circuit board 230 and the display panel 100.

The data driving chip 210 may be mounted on the flexible substrate 240 as a COF. For example, the data driving chip 210 may adhere to the flexible substrate 240 by an adhesive layer 270 interposed between the data driving chip 210 and the flexible substrate 240.

The data driving chip 210 may include a data driving chip body 215 and a plurality of first pads 212 disposed on a top surface of the data driving chip body 215. In addition, the display panel driver 200 may further include a first bonding wire 250 electrically connecting at least one first pad 212 with at least one bonding pad 242 of the flexible substrate 240.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 arranged along a top surface of the gate driving chip body 225. In addition, the display panel driver 200 may further include a second bonding wire 260 electrically connecting at least one second pad 222 with at least one bonding pad 244 of the flexible substrate 240.

The sealing member 290 may be provided on the flexible substrate 240 to cover the data driving chip 210 and the gate driving chip 220. The sealing member 290 may protect the data driving chip 210 and the gate driving chip 220. The sealing member 290 may include an epoxy compound.

For example, the at least one bonding pad 242 of the flexible substrate 240 may be electrically connected to one of the data lines DL, and the at least one bonding pad 244 of the flexible substrate 240 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The sealing member 290 may protect the first bonding wire 250 and the second bonding wire 260 to increase an electrical reliability of the first and second bonding wires 250 and 260.

Figure 11:
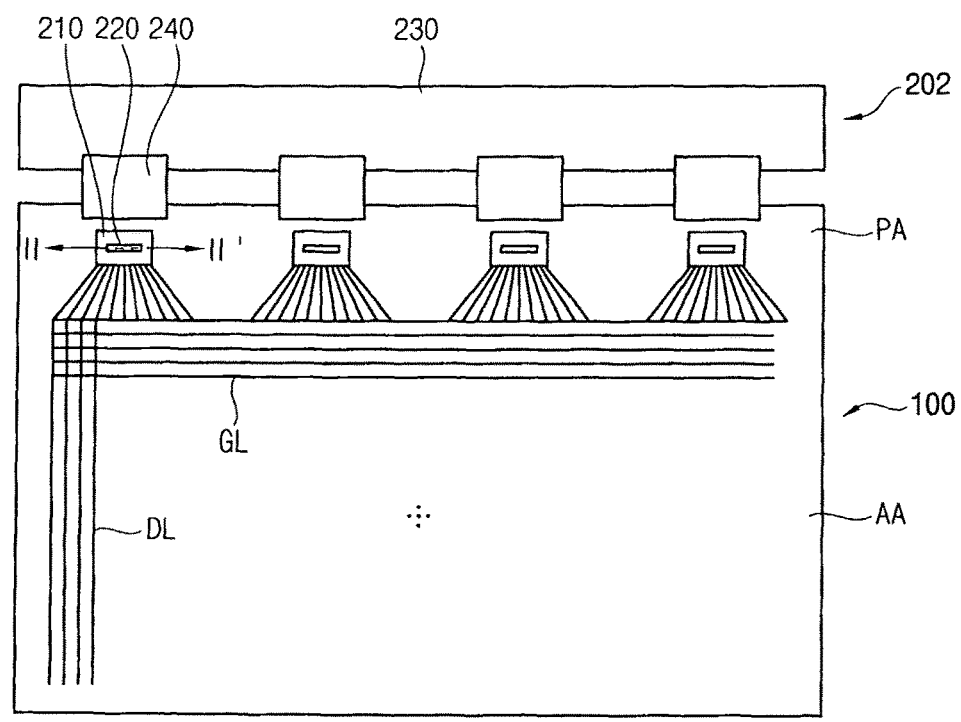
FIG. 11 is a plan view illustrating a display apparatus, according to an exemplary embodiment of the present invention.
Figure 12:
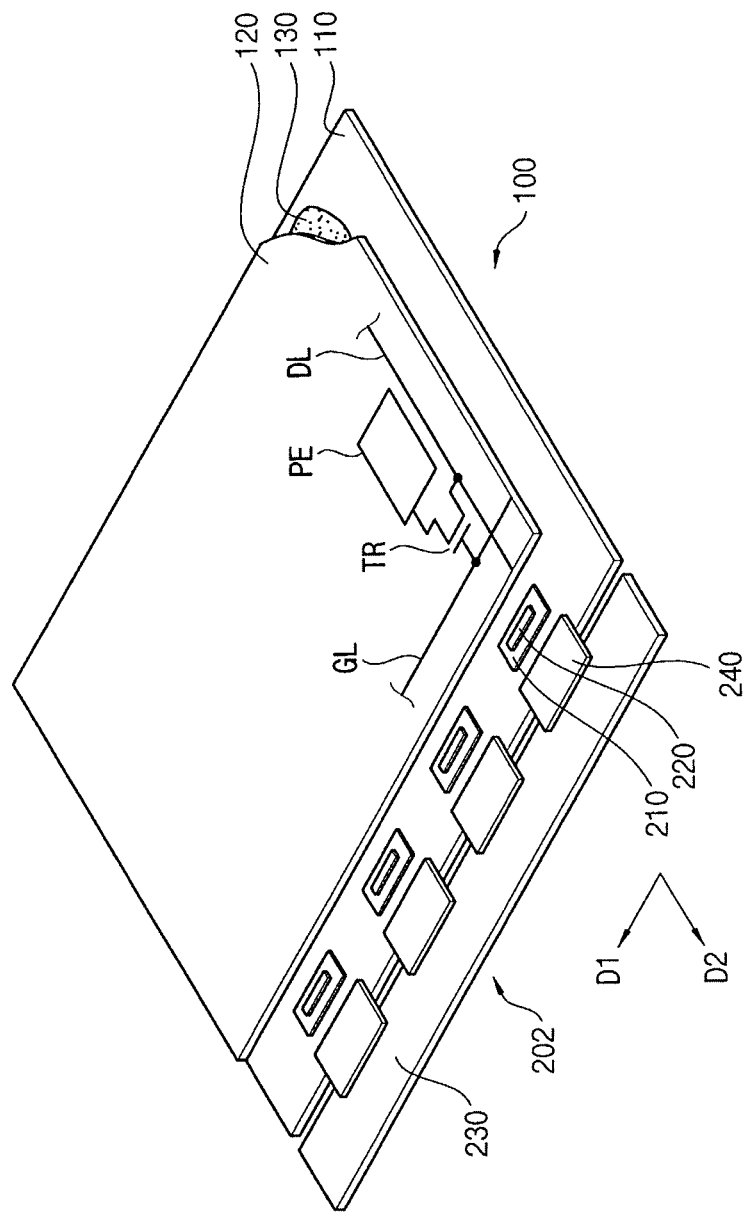
FIG. 12 is a perspective view illustrating the display apparatus of FIG. 11, according to an exemplary embodiment of the present invention.
Figure 13:
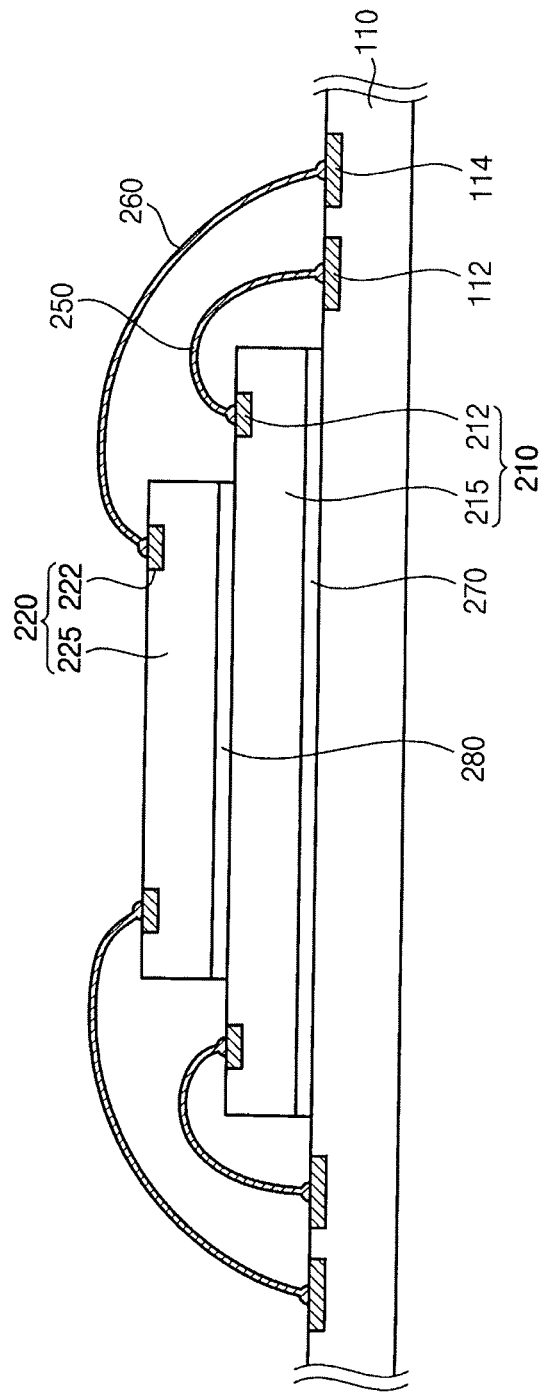
FIG. 13 is a cross-sectional view taken along line II-II' of FIG. 11, according to an exemplary embodiment of the present invention.

FIG. 11 is a plan view illustrating a display apparatus, according to an exemplary embodiment of the present invention. FIG. 12 is a perspective view illustrating the display apparatus of FIG. 11, according to an exemplary embodiment of the present invention. FIG. 13 is a cross-sectional view taken along line II-II' of FIG. 11, according to an exemplary embodiment of the present invention. The display apparatus of FIGS. 11 to 13 may be substantially the same as that of FIGS. 1 to 4, except for stacking a gate driving chip and a data driving chip on a first substrate. Accordingly, a repetitive description of elements already described may be omitted for brevity.

Referring to FIGS. 11 to 13, a display apparatus includes a display panel 100 and display panel driver 202.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110. The first substrate 110 may include a plurality of bonding pads 112 and 114 disposed in the peripheral region PA.

The display panel driver 202 may include a data driving chip 210 and a gate driving chip 220. The display panel driver 202 may further include a printed circuit board 230 and a flexible substrate 240. The flexible substrate 240 may electrically connect the printed circuit board 230 and the display panel 100.

The data driving chip 210 may be mounted on the first substrate 110 as a chip on glass COG. For example, the data driving chip 210 may be adhered to the first substrate 110 by an adhesive layer 270 interposed between the data driving chip 210 and the first substrate 110.

The data driving chip 210 may include a data driving chip body 215 and a plurality of first pads 212 disposed on a top surface of the data driving chip body 215. In addition, the display panel driver 202 may further include a first bonding wire 250 electrically connecting at least one first pad 212 with at least one bonding pad 112 of the first substrate 110.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 arranged along a top surface of the gate driving chip body 225. In addition, the display panel driver 202 may further include a second bonding wire 260 electrically connecting at least one second pad 222 with at least one bonding pad 114 of the first substrate 110.

For example, the at least one bonding pad 112 of the first substrate 110 may be electrically connected to one of the data lines DL, and the at least one bonding pad 114 of the first substrate 110 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

Figure 14:
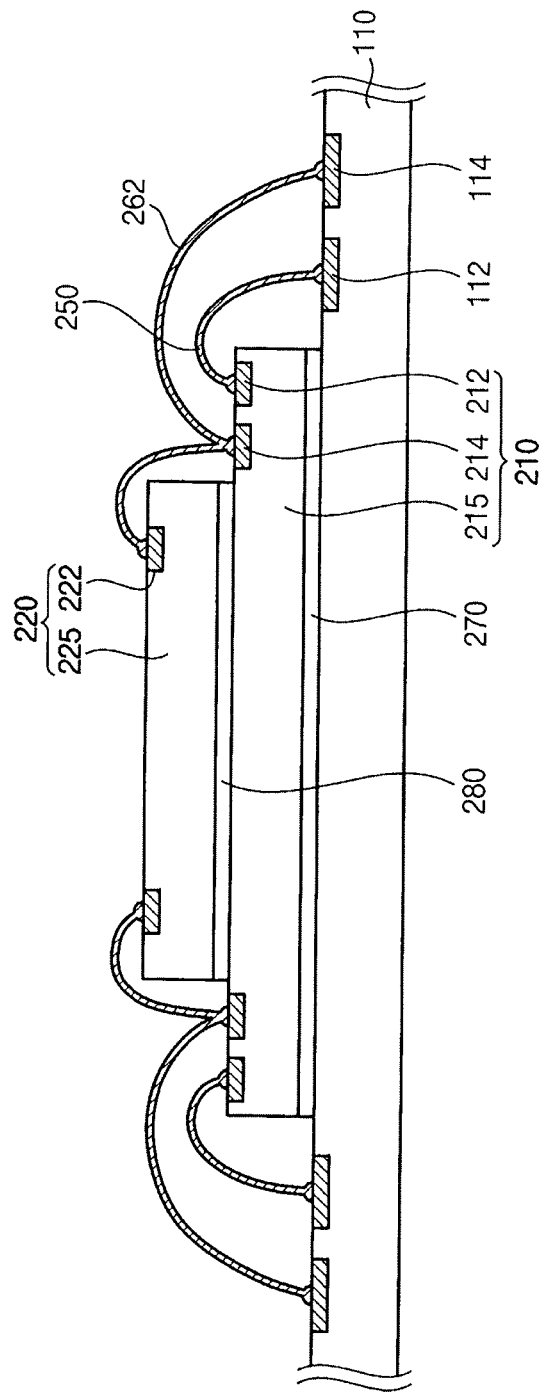
FIG. 14 is a cross-sectional view illustrating a display panel driver, according to an exemplary embodiment of the present invention.

FIG. 14 is a cross-sectional view illustrating a display panel driver, according to an exemplary embodiment of the present invention. The display panel driver of FIG. 14 may be substantially the same as that of FIG. 5, except for stacking a gate driving chip and a data driving chip on a first substrate. In addition, the display panel driver of FIG. 14 may be substantially the same as that of FIG. 13, except for a shape of a second bonding wire. Accordingly, a repetitive description of elements already described may be omitted for brevity.

Referring to FIGS. 11, 12 and 14, a display apparatus includes a display panel 100 and display panel driver 202.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110. The first substrate 110 may include a plurality of bonding pads 112 and 114 disposed in the peripheral region PA.

The display panel driver 202 may include a data driving chip 210 and a gate driving chip 220. The display panel driver 202 may further include a printed circuit board 230 and a flexible substrate 240. The flexible substrate 240 may electrically connect the printed circuit board 230 and the display panel 100.

The data driving chip 210 may be mounted on the first substrate 110 as a COG. For example, the data driving chip 210 may be adhered to the first substrate 110 by an adhesive layer 270 interposed between the data driving chip 210 and the first substrate 110.

The data driving chip 210 may include a data driving chip body 215 and a plurality of first pads 212 and 214 disposed on a top surface of the data driving chip body 215. In addition, the display panel driver 202 may further include a first bonding wire 250 electrically connecting at least one first pad 212 with at least one bonding pad 112 of the first substrate 110.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 disposed on a top surface of the gate driving chip body 225. In addition, the display panel driver 202 may further include a second bonding wire 262. The second bonding wire 262 electrically connects at least one second pad 222 with at least one first pad 214, and electrically connects the at least one first pad 214 with at least one bonding pad 114 of the first substrate 110.

For example, the at least one bonding pad 112 of the first substrate 110 may be electrically connected to one of the data lines DL, and the at least one bonding pad 114 of the first substrate 110 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The second bonding wire 262 may electrically connect the at least one bonding pad 114 of the first substrate 110 with the at least one second pad 222 through the at least one first pad 214 on the top surface of the data driving chip body 215 to increase electrical reliability.

Figure 15:
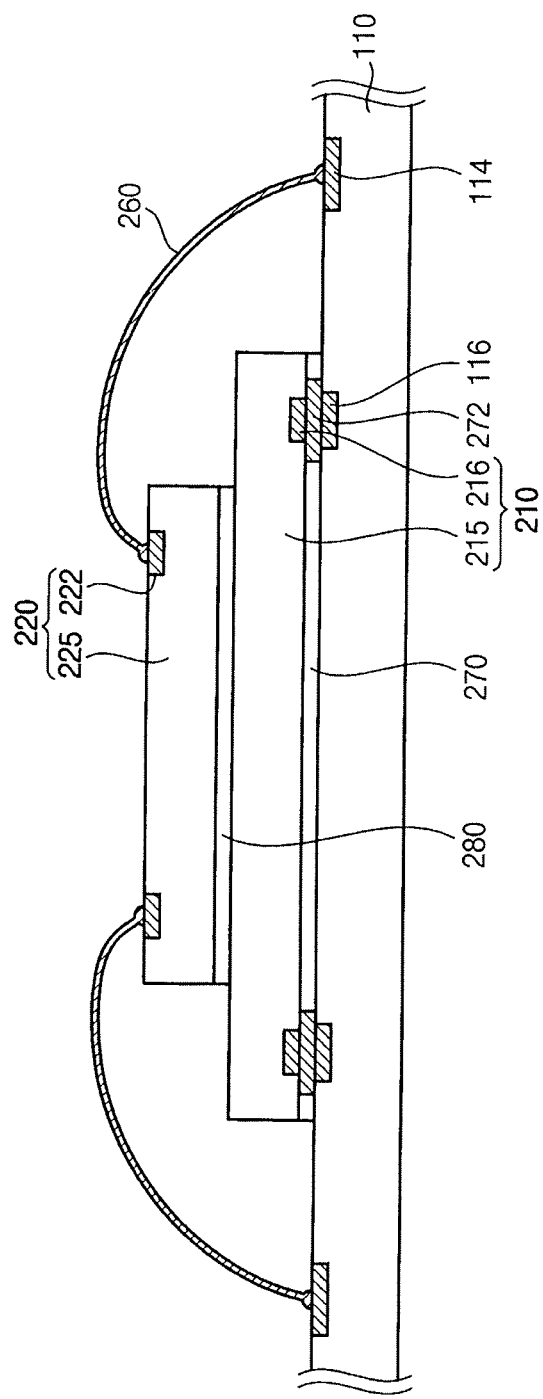
FIG. 15 is a cross-sectional view illustrating a display panel driver, according to an exemplary embodiment of the present invention.

FIG. 15 is a cross-sectional view illustrating a display panel driver, according to an exemplary embodiment of the present invention. The display panel driver of FIG. 15 may be substantially the same as that of FIG. 6, except for stacking a gate driving chip and a data driving chip on a first substrate. Accordingly, a repetitive description of elements already described may be omitted for brevity.

Referring to FIGS. 11, 12 and 15, a display apparatus includes a display panel 100 and display panel driver 202.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110. The first substrate 110 may include a plurality of bonding pads 116 and 114 disposed on the peripheral region PA.

The display panel driver 202 may include a data driving chip 210 and a gate driving chip 220. The display panel driver 202 may further include a printed circuit board 230 and a flexible substrate 240. The flexible substrate 240 may electrically connect the printed circuit board 230 with the display panel 100.

The data driving chip 210 may be mounted on the first substrate 110 as a COG. For example, the data driving chip 210 may be adhered to the first substrate 110 by an adhesive layer 270 interposed between the data driving chip 210 and the first substrate 110.

The data driving chip 210 may include a data driving chip body 215 and a plurality of third pads 216 disposed on a bottom surface of the data driving chip body 215. In addition, the display panel driver 202 may further include a first conductive adhesive layer 272 interposed between the data driving chip 210 and the first substrate 110. The first conductive adhesive layer 272 may electrically connect at least one third pad 216 with at least one bonding pad 116 of the first substrate 110.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 arranged along a top surface of the gate driving chip body 225. In addition, the display panel driver 202 may further include a second bonding wire 260 electrically connecting at least one second pad 222 with at least one bonding pad 114 of the first substrate 110.

For example, the at least one bonding pad 116 of the first substrate 110 may be electrically connected to one of the data lines DL, and the at least one bonding pad 114 of the first substrate 110 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The data driving chip 210 may be electrically connected to the first substrate 110 not through a bonding wire but through the first conductive adhesive layer 272 such that a manufacturing process of the display device is simplified.

Figure 16:
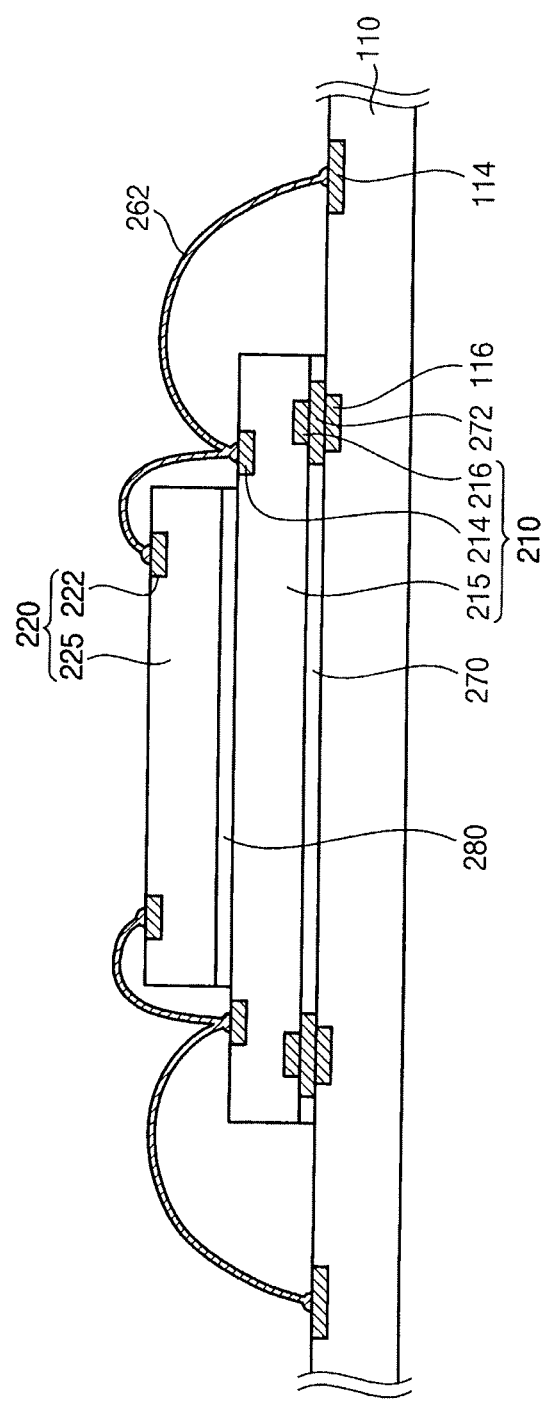
FIG. 16 is a cross-sectional view illustrating a display panel driver, according to an exemplary embodiment of the present invention.

FIG. 16 is a cross-sectional view illustrating a display panel driver, according to an exemplary embodiment of the present invention. The display panel driver of FIG. 16 may be substantially the same as that of FIG. 7, except for stacking a gate driving chip and a data driving chip on a first substrate. Accordingly, a repetitive description of elements already described may be omitted for brevity.

Referring to FIGS. 11, 12 and 16, a display apparatus includes a display panel 100 and display panel driver 202.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110. The first substrate 110 may include a plurality of bonding pads 116 and 114 disposed on the peripheral region PA.

The display panel driver 202 may include a data driving chip 210 and a gate driving chip 220. The display panel driver 202 may further include a printed circuit board 230 and a flexible substrate 240. The flexible substrate 240 may electrically connect the printed circuit board 230 and the display panel 100.

The data driving chip 210 may be mounted on the first substrate 110 as a COG. For example, the data driving chip 210 may be adhered to the first substrate 110 by an adhesive layer 270 interposed between the data driving chip 210 and the first substrate 110.

The data driving chip 210 may include a data driving chip body 215, a plurality of third pads 216 disposed on a bottom surface of the data driving chip body 215 and a plurality of first pads 214 disposed on a top surface of the data driving chip body 215. In addition, the display panel driver 202 may further include a first conductive adhesive layer 272 interposed between the data driving chip 210 and the first substrate 110. The first conductive adhesive layer 272 may electrically connect at least one third pad 216 with at least one bonding pad 116 of the first substrate 110.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of second pads 222 disposed on a top surface of the gate driving chip body 225. In addition, the display panel driver 202 may further include a second bonding wire 262. The second bonding wire 262 electrically connects at least one second pad 222 with at least one first pad 214, and electrically connects the at least one first pad 214 with at least one bonding pad 114 of the first substrate 110.

For example, the at least one bonding pad 116 of the first substrate 110 may be electrically connected to one of the data lines DL, and the at least one bonding pad 114 of the first substrate 110 may be electrically connected to one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The data driving chip 210 may be electrically connected to the first substrate 110 not through a bonding wire but through the first conductive adhesive layer 272 such that a manufacturing process of the display device is simplified.

In addition, the second bonding wire 262 may be electrically connected to the at least one bonding pad 114 of the first substrate 110 through the at least one first pad 214 to increase an electrical reliability of the display apparatus.

Figure 17:
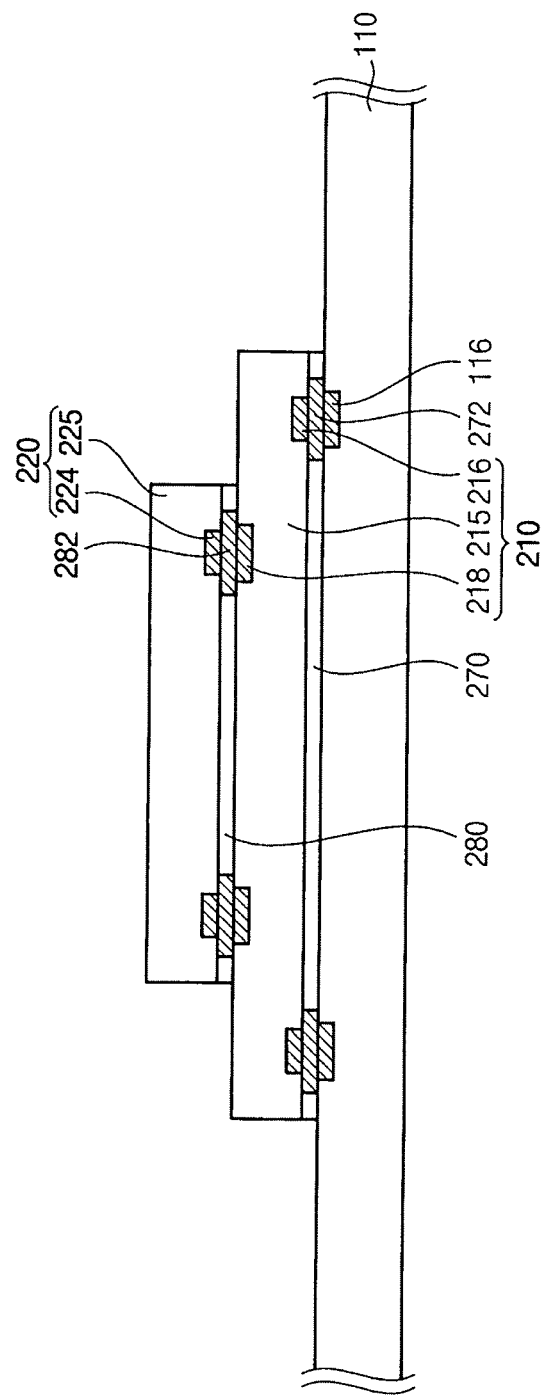
FIG. 17 is a cross-sectional view illustrating a display panel driver, according to an exemplary embodiment of the present invention.

FIG. 17 is a cross-sectional view illustrating a display panel driver, according to an exemplary embodiment of the present invention. The display panel driver of FIG. 17 may be substantially the same as that of FIG. 8, except for stacking a gate driving chip and a data driving chip on a first substrate. Accordingly, a repetitive description of elements already described may be omitted for brevity.

Referring to FIGS. 11, 12 and 17, a display apparatus includes a display panel 100 and display panel driver 202.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110. The first substrate 110 may include a plurality of bonding pads 116 disposed on the peripheral region PA.

The display panel driver 202 may include a data driving chip 210 and a gate driving chip 220. The display panel driver 202 may further include a printed circuit board 230 and a flexible substrate 240. The flexible substrate 240 may electrically connect the printed circuit board 230 with the display panel 100.

The data driving chip 210 may be mounted on the first substrate 110 as a COG. For example, the data driving chip 210 may be adhered to the first substrate 110 by an adhesive layer 270 interposed between the data driving chip 210 and the first substrate 110.

The data driving chip 210 may include a data driving chip body 215, a plurality of third pads 216 disposed on a bottom surface of the data driving chip body 215 and a plurality of first pads 218 disposed on a top surface of the data driving chip body 215. In addition, the display panel driver 202 may further include a first conductive adhesive layer 272 interposed between the data driving chip 210 and the first substrate 110. The first conductive adhesive layer 272 may electrically connect at least one third pad 216 with at least one bonding pad 116 of the first substrate 110.

The gate driving chip 220 may be stacked on the data driving chip 210. For example, the gate driving chip 220 may be adhered to the top surface of the data driving chip body 215 by an adhesive layer 280 interposed between the gate driving chip 220 and the data driving chip 210.

The gate driving chip 220 may include a gate driving chip body 225 and a plurality of fourth pads 224 disposed on a bottom surface of the gate driving chip body 225. The display panel driver 202 may further include a second conductive adhesive layer 282 interposed between the gate driving chip 220 and the data driving chip 210. The second conductive adhesive layer 282 may electrically connect at least one fourth pad 224 with at least one first pad 218.

For example, the at least one bonding pad 116 of the first substrate 110 may be electrically connected to one of the data lines DL or one of the gate lines GL.

According to an exemplary embodiment of the present invention, the gate driving chip 220 may be stacked on the data driving chip 210. Accordingly, the gate driving chip 220 does not need to be disposed on a short side of the display panel 100. Thus, a size of a bezel of the display apparatus is decreased. In addition, by stacking the gate driving chip 220 on the data driving chip 210, production costs and manufacturing time of a display apparatus decreases.

The data driving chip 210 and gate driving chip 220 may be electrically connected to the first substrate 110 not through a bonding wire but through the first conductive adhesive layer 272 and the second conductive adhesive layer 282 such that a manufacturing process of the display device is simplified.

Figure 18:
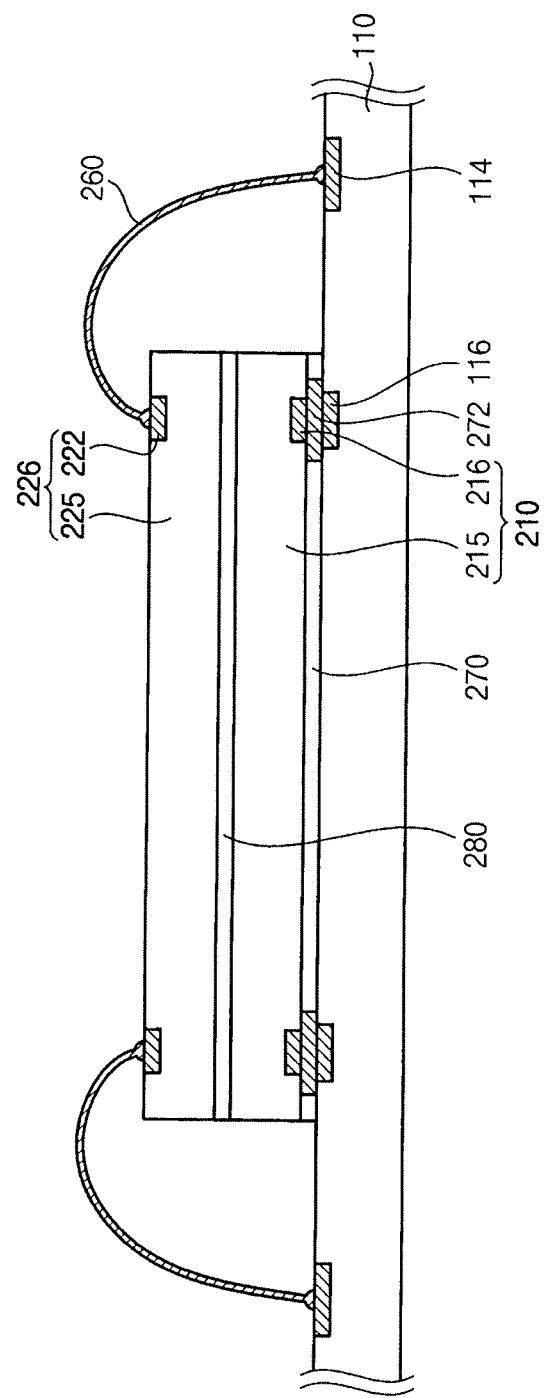
FIG. 18 is a cross-sectional view illustrating a display panel driver, according to an exemplary embodiment of the present invention.

FIG. 18 is a cross-sectional view illustrating a display panel driver, according to an exemplary embodiment of the present invention. The display panel driver of FIG. 18 may be substantially the same as that of FIG. 9, except for stacking a gate driving chip and a data driving chip on a first substrate. Thus like reference numerals refer to like elements, and repetitive explanations thereon may be omitted herein.

Referring to FIGS. 11, 12 and 18, a display apparatus includes a display panel 100 and display panel driver 202.

The display panel 100 includes an active region AA on which an image is displayed and a peripheral region PA adjacent to the active region AA. The peripheral region PA does not display an image. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor and a storage capacitor. The liquid crystal capacitor and the storage capacitor are electrically connected to the switching element TR. The pixels may be disposed in a matrix form.

The display panel 100 may include a first substrate 110 and a second substrate 120 opposite to the first substrate 110. The first substrate 110 may include a plurality of bonding pads 116 and 114 disposed in the peripheral region PA.

The display panel driver 202 may include a data driving chip 210 and a gate driving chip 226. The display panel driver 202 may further include a printed circuit board 230 and a flexible substrate 240. The flexible substrate 240 may electrically connect the printed circuit board 230 and the display panel 100.

The data driving chip 210 may be mounted on the first substrate 110 as a COG. For example, the data driving chip 210 may be adhered to the first substrate 110 by an adhesive layer 270 interposed between the data driving chip 210 and the first substrate 110.

The data driving chip 210 may include a data driving chip body 215 and a plurality of third pads 216 disposed on a bottom surface of the data driving chip body 215. In addition, the display panel driver 202 may further include a first conductive adhesive layer 272 interposed between the data driving chip 210 and the first substrate 110. The first conductive adhesive layer 272 may electrically connect at least one third pad 216 with at least one bonding pad 116 of the first substrate 110.

The gate driving chip 226 may be stacked on the data driving chip 210. For example, the gate driving chip 226 may be adhered to the top surface of the data driving chip body 215 by an adhesive layer 280 interposed between the gate driving chip 226 and the data driving chip 210.

The gate driving chip 226 may include a gate driving chip body 225 and a plurality of second pads 222 disposed on a top surface of the gate driving chip body 225. In addition, the display panel driver 202 may further include a second bonding wire 260 electrically connecting at least one second pad 222 with at least one bonding pad 114 of the first substrate 110.

In an exemplary embodiment of the present invention, a size of the gate driving chip 226 may be substantially the same as a size of the data driving chip 210 in plan view.

For example, the at least one bonding pad 116 of the first substrate 110 may be electrically connected to one of the data lines DL, and the at least one bonding pad 114 of the first substrate 110 may be electrically connected to one of the gate lines GL.

According to an exemplary embodiment of the present invention, the gate driving chip 226 may be stacked on the data driving chip 210. Accordingly, the gate driving chip 226 does not need to be disposed on a short side of the display panel 100. Thus, a size of a bezel of the display apparatus is decreased. In addition, by stacking the gate driving chip 226 on the data driving chip 210, production costs and manufacturing time of a display apparatus decreases.

The data driving chip 210 may be electrically connected to the first substrate 110 not through a bonding wire but through the first conductive adhesive layer 272 such that a manufacturing process becomes easy.

In addition, the size of the gate driving chip 226 and the size of the data driving chip 210 may be substantially the same as each other for convenience of aligning the gate driving chip 226 on the data driving chip 210.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A display apparatus comprising:
   a display panel including a first substrate and a second substrate facing the first substrate, wherein the first substrate includes a switching element, a data line and a gate line, wherein the data line and the gate line are electrically connected to the switching element; and
   a display panel driver including a data driving chip and a gate driving chip, wherein the data driving chip and the gate driving chip are both disposed on a same side of the display panel, wherein the data driving chip applies a data signal to the data line and the gate driving chip applies a gate signal to the gate line, wherein the gate driving chip is disposed on a surface of the data driving chip.

2. The display apparatus of claim 1, wherein the display panel driver further comprises:
   a printed circuit board including a driving circuit; and
   a flexible substrate including a plurality of bonding pads, wherein the flexible substrate electrically connects the printed circuit board with the display panel,
   wherein the data driving chip is disposed on the flexible substrate.

3. The display apparatus of claim 2, wherein the data driving chip comprises:
   a data driving chip body; and
   a first pad disposed on a top surface of the data driving chip body, wherein the display panel driver further includes a first bonding wire electrically connecting the first pad with a first bonding pad of the plurality of bonding pads of the flexible substrate.

4. The display apparatus of claim 3, wherein the gate driving chip comprises:
 a gate driving chip body; and
 a second pad disposed on a top surface of the gate driving chip body,
 wherein the display panel driver further includes a second bonding wire electrically connecting the second pad with a second bonding pad of the plurality of bonding pads of the flexible substrate.

5. The display apparatus of claim 4, wherein the data driving chip further comprises a third pad disposed on the top surface of the data driving chip body, wherein the second bonding wire electrically connects the second pad and the third pad with the second bonding pad of the plurality of bonding pads of the flexible substrate.

6. The display apparatus of claim 2, wherein the data driving chip comprises:
 a data driving chip body; and
 a third pad disposed on a bottom surface of the data driving chip body,
 wherein the display panel driver further includes a first conductive adhesive layer disposed between the data driving chip and the flexible substrate, and
 wherein the first conductive adhesive layer electrically connects the third pad with a first bonding pad of the plurality of bonding pads of the flexible substrate.

7. The display apparatus of claim 6, wherein the gate driving chip comprises
 a gate driving chip body; and
 a second pad disposed on a top surface of the gate driving chip body,
wherein the display panel driver further includes a second bonding wire electrically connecting the second pad with a second bonding pad of the plurality of bonding pads of the flexible substrate.

8. The display apparatus of claim 7, wherein the data driving chip further includes a first pad disposed on a top surface of the data driving chip body, and
 wherein the second bonding wire electrically connects the first pad and the second pad with the second bonding pad of the plurality of bonding pads of the flexible substrate.

9. The display apparatus of claim 6, wherein the gate driving chip comprises:
 a gate driving chip body; and
 a fourth pad disposed on a bottom surface of the gate driving chip body,
 wherein the data driving chip further includes a first pad disposed on a top surface of the data driving chip body,
 wherein the display panel driver further includes a second conductive adhesive layer disposed between the gate driving chip and the data driving chip, and
 wherein the second conductive adhesive layer electrically connects the fourth pad with the first pad.

10. The display apparatus of claim 1, wherein the data driving chip is disposed on the first substrate, wherein the first substrate includes a plurality of bonding pads, wherein the data driving chip is electrically connected to the first substrate through the plurality of bonding pads.

11. The display apparatus of claim 10, wherein the data driving chip further comprises:
 a data driving chip body; and
 a first pad disposed on a top surface of the data driving chip body,
 wherein the display panel driver further includes a first bonding wire electrically connecting the first pad with a first bonding pad of the plurality of bonding pads of the first substrate.

12. The display apparatus of claim 11, wherein the gate driving chip further comprises:
 a gate driving chip body; and
 a second pad disposed on a top surface of the gate driving chip body,
 wherein the display panel driver further includes a second bonding wire electrically connecting the second pad with a second bonding pad of the plurality of bonding pads of the first substrate.

13. The display apparatus of claim 12, wherein the data driving chip further comprises a third pad disposed on the top surface of the data driving chip body, wherein the second bonding wire electrically connects the second pad and the third pad with the second bonding pad of the plurality of bonding pads of the first substrate.

14. The display apparatus of claim 10, wherein the data driving chip comprises:
 a data driving chip body; and
 a third pad disposed on a bottom surface of the data driving chip body,
 wherein the display panel driver further includes a first conductive adhesive layer disposed between the data driving chip and the first substrate, and
 wherein the first conductive adhesive layer electrically connects the third pad with a first bonding pad of the plurality of bonding pads of the first substrate.

15. The display apparatus of claim 14, wherein the gate driving chip comprises:
 a gate driving chip body; and
 a second pad disposed on a top surface of the gate driving chip body,
 wherein the display panel driver further includes a second bonding wire electrically connecting the second pad with a second bonding pad of the plurality of bonding pads of the first substrate.

16. The display apparatus of claim 15, wherein the data driving chip further includes a first pad disposed on a top surface of the data driving chip body, and
 wherein the second bonding wire electrically connects the first pad and the second pad with the second bonding pad of the plurality of bonding pads of the first substrate.

17. The display apparatus of claim 14, wherein the gate driving chip comprises:
 a gate driving chip body; and
 a fourth pad disposed on a bottom surface of the gate driving chip body,
 wherein the data driving chip further includes a first pad disposed on a top surface of the data driving chip body,
 wherein the display panel driver further includes a second conductive adhesive layer disposed between the gate driving chip and the data driving chip, and
 wherein the second conductive adhesive layer electrically connects the fourth pad with the first pad.

18. The display apparatus of claim 1, wherein a size of the gate driving chip is substantially the same as a size of the data driving chip in plan view.

19. The display apparatus of claim 1, wherein a size of the gate driving chip is less than a size of the data driving chip in plan view.

20. The display apparatus of claim 1, wherein the display panel driver further includes a sealing member covering the data driving chip and the gate driving chip.

21. The display apparatus of claim 1, wherein the display panel further comprises:
- a flexible substrate including a plurality of bonding pads arranged in a row, Wherein odd numbered bonding pads are connected to pads of the gate driving chip and even numbered bonding pads are connected to pads of the data driving chip, wherein the odd numbered bonding pads are connected to a plurality of the gate lines and the even numbered bonding pads are connected to a plurality of the data lines.

22. The display apparatus of claim 1,
- wherein the display panel driver is connected to a plurality of pads of the display panel by a plurality of bonding wires disposed in a fan shape,
- wherein each of the plurality of bonding wires extends diagonally from a side of the display panel driver nearest to the display panel,
- wherein the plurality of bonding wires further includes odd numbered bonding wires connected to pads of the gate driving chip and even numbered bonding wires connected to pads of the data driving chip, and
- wherein the plurality of pads are disposed in a straight line parallel to a first gate line.

* * * * *